United States Patent [19]

Murakami et al.

[11] Patent Number: 5,047,838
[45] Date of Patent: Sep. 10, 1991

[54] ADAPTIVE COMB FILTER

[75] Inventors: Tokumichi Murakami; Atsushi Ito; Kohtaro Asai, all of Kamakura, Japan

[73] Assignee: Mitsubishi Denki K.K., Tokyo, Japan

[21] Appl. No.: 552,953

[22] Filed: Jul. 16, 1990

Related U.S. Application Data

[60] Division of Ser. No. 251,990, Sep. 29, 1988, Pat. No. 4,974,065, which is a continuation of Ser. No. 98,592, Sep. 18, 1987, abandoned, which is a continuation of Ser. No. 684,836, Dec. 21, 1984, abandoned.

[30] Foreign Application Priority Data

Dec. 22, 1983 [JP] Japan .................. 58-242367
Jan. 24, 1984 [JP] Japan .................. 59-21147
Mar. 5, 1984 [JP] Japan .................. 59-82506
Apr. 20, 1984 [JP] Japan .................. 59-123089

[51] Int. Cl.$^5$ .................. H04N 11/04; H04N 7/13
[52] U.S. Cl. .................. 358/13; 358/138
[58] Field of Search .................. 358/138, 13

[56] References Cited

U.S. PATENT DOCUMENTS

| | | | |
|---|---|---|---|
| 2,921,124 | 1/1960 | Graham | 358/138 |
| 4,141,035 | 2/1979 | Maxemchuk et al. | 358/31 |
| 4,320,416 | 3/1982 | Dischert et al. | 358/133 |
| 4,352,122 | 9/1982 | Reitmeier et al. | 358/11 |
| 4,417,269 | 11/1983 | Dischert | 358/13 |
| 4,425,588 | 1/1984 | Baldwin | 358/138 |
| 4,605,963 | 8/1986 | Reitmeier et al. | 358/138 |

FOREIGN PATENT DOCUMENTS 71174 9/1973 Japan .
2035745 6/1980 United Kingdom .................. 358/13

OTHER PUBLICATIONS

Devereux et al., Pulse–Code Modulation of Video Signals:Codes Specifically Designed for Pal, Proc. IEE, vol. 125, No. 6, Jun. 1978, pp. 591-8.

"Digital Frame Memory for Still Picture Television Receivers Pass Encoding System and Application", T. Yoshino et al., SMPTE Journal, vol. 89, pp. 257-262, Apr., 1980.

Primary Examiner—John W. Shepperd
Attorney, Agent, or Firm—Sughrue, Mion, Zinn, Macpeak & Seas

[57] ABSTRACT

A subnyquist sampling filter which results in less loss of picture resolution. An adaptive prefilter perform low-pass filter processing on a series of picture signals sampled in the form of a square lattice in a direction in which it has been determined that the degree of change of the picture signal at the periphery of an extracted picture element is a minimum. An adaptive interpolation filter performs interpolation processing on the picture signal obtained by subnyquist sampling with a subsampler the picture signal output from the adaptive prefilter in the direction where the degree of change of the picture signal level at the periphery of the abstracted picture elements is a minimum.

6 Claims, 4 Drawing Sheets

○ : SAMPLE PICTURE ELEMENT  ● : INTERPOLATION PICTURE ELEMENT

ADAPTIVE COMB FILTER

This is a divisional of application Ser. No. 07/251,990, filed Sept. 29, 1988 now U.S. Pat. No. 4,974,065, which is a continuation of application Ser. No. 07/98,592, filed Sept. 18, 1987, which is a continuation of application Ser. No. 06/684,836, filed Dec. 21, 1984, both now abandoned.

The present invention relates to a subnyquist sampling filter for recovering a high quality picture signal from a quantized picture signal sampled at a sampling frequency equal to or lower than the nyquist frequency, for example, for high quality digital transmission of television picture signals.

An existing subnyquist sampling method wherein a signal is sampled with a sampling frequency lower than the nyquist frequency, will be explained referring to FIG. 1. FIG. 9 shows the allocation of a picture signal extracted by subsampling from a series of existing picture signals sampled in the form of a square lattice. In this figure, the maximum frequency of the picture signal is $f_v$, the nyquist sampling frequency of the picture signal is $f_s$, the subnyquist sampling frequency is $f_2/2''$ where $f_2 \geq 2f_v$. FIG. 1 also shows a two-dimensional allocation of a subnyquist sampled picture signal which has been obtained by phase inversion for each line period of horizontal scanning for a series of picture signals where the picture signal is sampled in the form of a square lattice on a two-dimensional allocation with the nyquist sampling frequency $f_s$. As shown in FIG. 1, white circles indicate sample picture element extracted by subnyquist sampling, while back circles indicate interpolated picture elements recovered by interpolation in order to compensate for the extracted picture elements.

As described above, a subnyquist sampling method is effective as a method of highly efficient coding to reduce the amount of data during transmission and recording by reducing the number of samples of the picture signal. A prefilter which suppresses loop noise produced by the subnyquist sampling and an interpolation filter which results in less interpolation noise during recovery are required in the subnyquist sampling filter.

FIG. 2 is a block diagram indicating an example of a conventional subnyquist sampling system: FIGS. 3 and 4, respectively, are block diagrams of a prefilter and an interpolation filter used in the subnyquist sampling system of FIG. 2. In these figures, D-2 and D-10 are A/D converters and D/A converters, respectively, D-4 is a prefilter, D-6 is a subsampler, D-8 is an interpolation filter, D-12 and D-18 are line delay circuits, D-14 and D-16 are dot delay circuits, D-20 is a low-pass filter, D-22 and D-25 are subsample line delay circuits, D-27 is an average value interpolation filter, and D-29 is an interpolation switch.

Operations of the subnyquist sampling system of the prior art shown in FIG. 2 will be explained. An analog input picture signal D-1 is sampled at the nyquist sampling frequency $f_s$ by the A/D converter D-2 and converted into a digital input picture signal D-3. This digital input picture signal D-3 is subjected to suppression of high frequency components to be folded back on the low frequency components by the prefilter D-4 and is then subnyquist sampled as shown in FIG. 1 in the subsampler D-6. The subnyquist sampled subsample output picture signal D-7 is subjected to interpolation of picture elements extracted by the interpolation filter D-8, converted to a digital recovered picture signal D-9, and then converted to an analog recovered picture signal D-11 by the D/A converter D-10.

The operations of the prefilter shown in FIG. 3 will now be described. Here, a digital input picture signal D-3 is indicated by S(m,n) corresponding to the picture element location. When S(m,n+1) indicated in FIG. 1 is input to the digital input picture signal D-3 through the line delay circuits D-12 and D-18 and the dot delay circuits D-14 and D-16, a total of five picture signals S(m,n+1) S(m+1,n), S(m,n), S(m−1,n) and S(m,n−1) (the latter four corresponding to D-13, D-15, D-17 and D-18, respectively) are output simultaneously. The low-pass filter 20 carries out the following equations on the picture signals D-3, D-13, D-15, D-17 and D-19, and also outputs the signal P(m,n) indicated below as the prefilter output picture signal D-5 for S(m,n).

$$P(m,n) = (\tfrac{1}{8})[S(m,n-1) + S(m-1,n) + 4S(m,n) + S(m+1,n) + S(m,n+1)].$$

The signal P(m,n) is an output of a two-dimensional low-pass filter D-20 which suppresses the high frequency components of the signal S(m,n) which cause loop noise.

The operations of the interpolation filter shown in FIG. 4 will be explained hereinafter. The output picture signal P(m,n) of the prefilter D-4 is reduced to a half in the amount of picture data it contains because of the skipped samplings. A series of samples of the output picture signal D-7, which is the output of subsampler D-6, are sequentially output as P(m,n−1), . . . , P(m−1,n), P(m+1,n), . . . , P(m,n+1), . . . on a time-sequential basis. Accordingly, the picture signal extracted by the subsampler D-6 is recovered by the interpolation filter D-8 as explained below. The subsample line delay circuits D-22 and D-25 and the dot delay circuit D-14 simultaneously output the four picture signals of P(m−1,n), P(m+1,n) and P(m,n−1) (corresponding to D-23, D-24 and D-26) with such a timing that the signal P(m,n−1) of the subsample output picture signal D-7 is input. The average value interpolation filter D-27 recovers the interpolation picture signals Q(m,n) (D-28) indicated below corresponding to the element P(m,n) by the following processing from the picture signals mentioned above:

$$Q(m,n) = (\tfrac{1}{4})[P(m,n-1) + P(m-1,n) + P(m+1,n) + P(m,n+1)].$$

The interpolation switch D-29 alternately selects the subsample output picture signal D-23 and interpolation picture signal D-28 and obtains the recovered picture signals R(m,n) (D-9) as the time series . . . , P(m,n−1), . . . , Q(m−2,n), P(m−1,n), Q(m,n) P(m+1,n), . . . , P(m,n+1), . . . .

The prefilter and interpolation filter in the above subnyquist sampling system are capable of suppressing loop noise by subnyquist sampling, but, on the other hand, they reduce the two-dimensional frequency response of the original picture signal to a half. Namely, the existing subnyquist sampling system has a disadvantage that the resolution in each direction of the picture is lowered to about a half of the resolution provided in the original signal. Moreover, it is also possible to employ an interpolation filter which horizontally interpolates a lower frequency component in the horizontal direction and vertically interpolates a higher frequency component in the horizontal direction and a prefilter which is adaptive to such interpolation filter. However, this technique is also accompanied by a disadvantage that only a frequency response in two-dimensional space can be obtained as in the case of the existing subnyquist sampling system for frequency components which are high simultaneously in the vertical and horizontal directions.

SUMMARY OF THE INVENTION

The invention provides a subnyquist sampling filter with less loss of picture resolution comprising an adaptive prefilter which performs low-pass filter processing on a series of picture signals sampled in the form of a square lattice in the direction where a degree of change of picture signal level at the periphery of the extracted picture elements is a minimum, and an adaptive interpolation filter which performs interpolation processing on the picture signal obtained by subnyquist sampling with a subsampler the picture signal output form the adaptive prefilter in the direction where the degree of change of the picture signal level at the periphery of the extracted picture elements is a minimum.

BRIEF DESCRIPTION OF THE DRAWINGS

A preferred embodiment of the present invention will be explained hereinafter with reference to FIG. 5, which is a block diagram of a subnyquist sampling system utilizing a subnyquist sampling filter in accordance with the present invention. More specifically, FIG. 5 shows a block diagram of an adaptive prefilter. FIG. 6 shows a block diagram of an adaptive interpolation filter employed in the subnyquist sampling system shown in FIG. 5. In each of these figures, D-31 is adaptive prefilter, D-34 is an adaptive interpolation filter, D-41 is an activity arithmetic operation circuit, D-48 is a comparator circuit, D-49 is a low-pass filter bank, D-57 is a selector, and D-67 is an interpolation filter bank.

An analog input picture signal D-1 is sampled by the nyquist sampling frequency $f_s$ through the A/D converter D-2 and is then converted into a digital input picture signal D-3. Regarding this digital input picture signal D-3, the adaptive prefilter D-31 monitors for all samples the degree of change of picture signal level in each direction (activity) and executes low-pass filter processing in the direction of the lowest activity. The adaptive prefilter D-31 suppresses only the signal component (for example, irregular impulse signal component) which changes sharply in any direction (horizontal, vertical or oblique). Next, the adaptive prefilter output picture signal D-32, having passed the adaptive prefilter 31, is subnyquist sampled by the subsampler D-6 at the subnyquist sampling frequency $f_s$, whereupon the adaptive prefilter output picture signal D-32 becomes the subsample output picture signal D-33 through extraction. This subsample output picture signal D-33 is transmitted and recorded. In this case, the compression rate is ½. Thereafter, the adaptive interpolation filter D-34 monitors the image signal activity in each direction from the then-present subsample output picture signal D-33 and executes interpolation (for example, average value interpolation) through the setting of the subsample output picture signal D-33 in the direction of the lowest activity. The adaptive interpolation picture signal and sample output picture signal D-33 are alternately selected and the selected signal is sent to the D/A converter D-10 as the digital recovered picture signal D-35 having a nyquist rate of $1/f_s$, becoming the analog picture signal D-36.

Next, operations of the adaptive prefilter shown in FIG. 6 will be explained. The input digital input picture signal D-3 is delayed by the line delay circuits D-12 and D-18 and the dot delay circuits D-14 and D-16 such that the signal $S(m, n-1)$ and following four picture signals are output simultaneously. Namely, $S(m+1,n)$, $S(m,n)$, $S(m-1,n)$ and $D(m,n-1)$ (corresponding to D-37, D-38, D-39 and D-40, respectively) appear simultaneously. With these picture signals, the activity arithmetic operation circuit D-41 calculates the activity in the six directions around the dot point $S(m,n)$ on the display screen as indicated below:

Activity $A_1(m,n)$ in the vertical
direction:$= |S(m,n-1) - S(m,n+1)|$;

Activity $A_2(m,n)$ in the horizontal
direction:$= |S(m-1,n) - S(m+1,n)|$;

Activity $A_3(m,n)$ in the upper left
direction:$= |S(m,n-1) - S(m-1,n)|$;

Activity $A_4(m,n)$ in the upper right
direction:$= |S(m,n-1) - S(m+1,n)|$;

Activity $A_5(m,n)$ in the lower left
direction:$= |S(m-1,n) - S(m,n+1)|$;

Activity $A_6(m,n)$ in the lower right
direction:$= |S(m+1,n) - S(m,n+1)|$.

Figure 6:
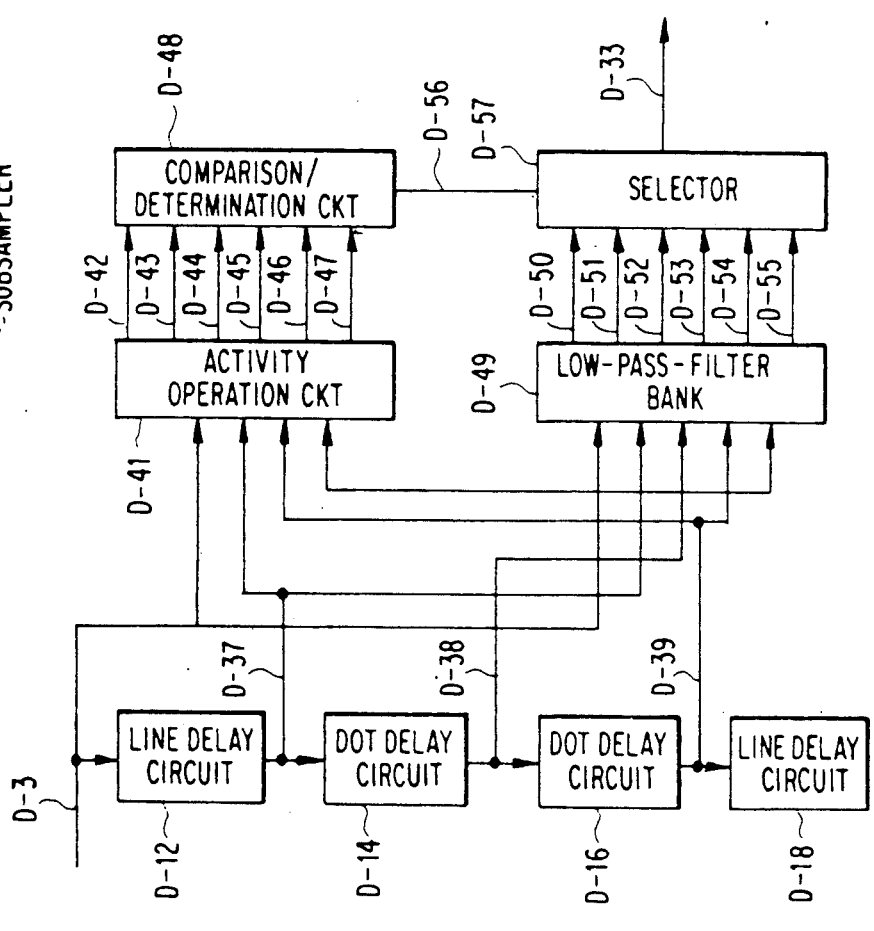
FIG. 6 is a block diagram of an adaptive prefilter circuit used in the subnyquist sampling system of FIG. 5.

(These activities correspond to signals D-42, D-43, D-44, D-45, D-46 and D-47, respectively, indicated in FIG. 6).

The activities $A_1(m,n)$ (i=1 to 6) in the above six directions are sent to the comparison and determination circuit D-48 and the direction where the minimum activity min $A_i(m,n)$ is obtained. The comparison and determination circuit D-48 outputs a code D-56 indicating the direction where the activity is a minimum. Simultaneously, the low-pass filter bank D-49 executes low-pass filter processing in the six directions using five samples of the picture signals D-3, D-37, D-38, D-39 and D-40. The output picture signals $X_i(m,n)$ (i=1 to 6) of the low-pass filter bank D-49 are as follows:

Filter output $X_1(m,n)$ in the vertical
direction:$=(\frac{1}{4})[S(m,n-1) + 2S(m,n) + S(m,n+1)]$;

Filter output $Z_2(m,n)$ in the horizontal
direction: $= (\frac{1}{4})[(m-1,n) + 2S(m,n) + S(m+1,n)]$;

Filter output $X_3(m,n)$ in the upper left
direction: $= (\frac{1}{4})[S(m,n-1) + 2S(m,n) + S(m-1,n)]$;

Filter output $X_4(m,n)$ in the upper right
direction: $= (\frac{1}{4})[S(m,n-1) + 2S(m,n) + S(m+1,n)]$;

Filter output $X_5(m,n)$ in the lower left
direction: $= (\frac{1}{4})[S(m-1,n) + 2S(m,n) + S(m,n+1)]$;
and Filter output $X_6(m,n)$ in the lower right
direction: $= (\frac{1}{4})[S(m+1,n) + 2S(m,n) + S(m,n+1)]$.

(These filter outputs correspond to signals D-50, D-51, D-52, D-53, D-54 and D-55, respectively, indicated in the drawings.)

From the above six filtered output picture signals $X_i(m,n)$, $X_K(m,n)$ is selected by the selector (D-57) in accordance with the code $K(m,n) = \{[i | \min A_i(m,n)]\}$ (D-56) in the direction where the activity is a minimum, thus becoming the adaptive prefilter output picture signal $X(m,n)$ (D-32) of the adaptive prefilter D-31. This adaptive prefilter output D-31 shows little deterioration of picture quality. Next, the adaptive prefilter output picture signal D-32 shows little deterioration of picture quality. Next, the adaptive prefilter output picture signal D-32 of the adaptive prefilter D-31 is subnyquist sampled through the subsampler D-6 to become the subsample output picture signal D-33. Namely, the signals ..., $X(m,n-1)$, ..., $X(m-1,n)$, $X(m+1,n)$, ..., $X(m,n+1)$, ... are obtained on a time sequential basis.

The operations of adaptive interpolation filter shown in FIG. 7 will be explained. When the signal $X(m,n+1)$ appears as the subsample output picture signal D-33, the subsample line delay circuits D-22 and D-25 and the dot delay circuit D-14 output simultaneously the picture signals of $X(m+1,n)$, $X(m-1,n)$ and $X(m,n-1)$ (corresponding to D-58, D-59 and D-60, respectively). At this time, the activity operation circuit D-41 calculates the activities $D_j(m,n)$ (j = 1 to 6) in the six directions around the coordinate (m,n):

Activity $B_1(m,n)$ in the vertical
direction: $= |X(m,n-1) - X(m,n+1')|$;

Activity $B_2(m,n)$ in the horizontal
direction: $= |X(m-1,n) - X(m+1,n)|$;

Activity $B_3(m,n)$ in the upper left
direction: $= |X(m,n-1) - X(m-1,n)|$;

Activity $B_4(m,n)$ in the upper right
direction: $= |X(m,n-1) - X(m+1,n)|$;

Activity $B_5(m,n)$ in the lower left
direction: $= |X(m-1,n) - X(m,n+1)|$; and

Activity $B_6(m,n)$ in the lower right
direction: $= |X(m+1,n) - X(m,n+1)|$.

Figure 7:
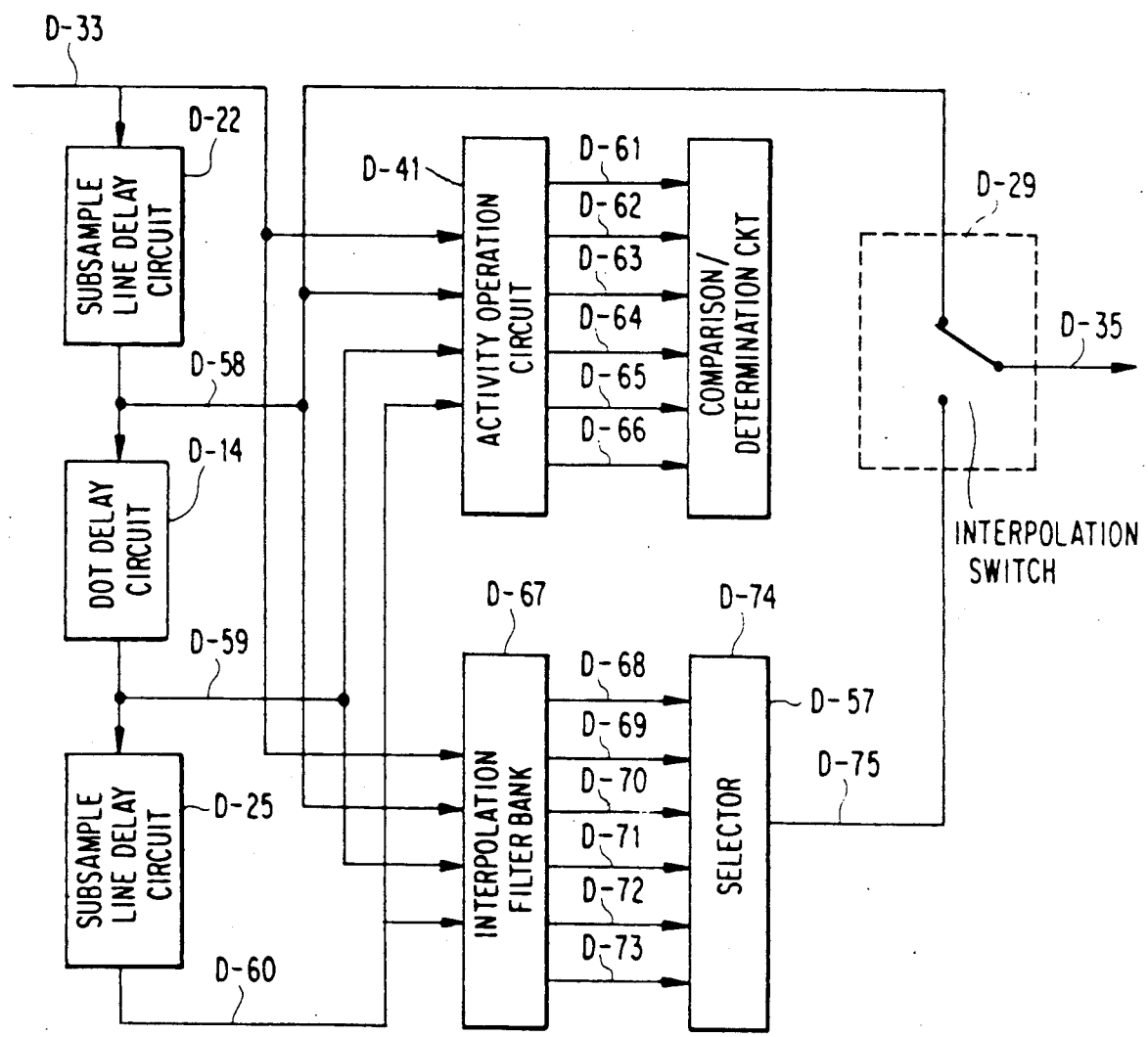
FIG. 7 is a block diagram showing an adaptive interpolation filter used in the subnyquist sampling system of FIG. 5.

(These activities correspond to signals D-61, D-62, D-63, D-64, D-65 and D-66, respectively, indicated in FIG. 7).

The direction where the activities $B_j(m,n)$ in the six directions in the vicinity of the coordinate (m,n) of the subsample output picture signal D-33 is a minimum is obtained by the comparison and determination circuit D-48. The code $L(m,n) = \{[j | \min B_j(m,n)]\}$ (D-74) indicating the direction where the activity is a minimum is sent to the selector D-57. Simultaneously, since the picture signals extracted by the subsampler D-6 in the interpolation filter bank D-67 are recovered by interpolation from the optimum direction, the adaptive interpolation picture signals $Y_i(m,n)$ (i = 1 to 6) in each direction can be obtained as indicated below by the interpolation filters in the six directions:

Interpolation filter output $Y_1(m,n)$ in the vertical
direction: $= (\frac{1}{2})[X(m,n-1) + X(m,n+1)]$;

Interpolation filter output $Y_2(m,n)$ in the horizontal
direction: $= (\frac{1}{2})[X(m-1,n) + X(m+1,n)]$;

Interpolation filter output $Y_3(m,n)$ in the upper left
direction: $= (\frac{1}{2})[X(m,n-1) + X(m-1,n)]$;

Interpolation filter output $Y_4$ in the upper right
direction: $= (\frac{1}{2})[X(m,n-1) + X(m+1,n)]$;

Interpolation filter output $Y_5(m,n)$ in the lower left
direction: $= (\frac{1}{2})[S(m-1, n) + X(m,n+1)]$; and Interpolation filter output $Y_6(m,n)$ in the lower right
direction: $= (\frac{1}{2}) [X(m+1,n) + X(m,n+1)]$.

(These filter outputs correspond to signals D-68, D-69, D-70, D-71, D-72 and D-73 indicated in FIG. 7.)

These adaptive interpolation picture signals $Y_j(m,n)$ (j = 1 to 6) are sent to the selector D-57 and the interpolation picture signal $Y_L(m,n)$ in the direction of minimum activity is selected and output as the adaptive interpolation picture signal $Y(m,n)$ in accordance with the code $L(m,n)$ in the direction of minimum activity. The interpolation switch D-29 alternately selects the subsample output picture signal D-58 at the subnyquist rate and the adaptive interpolation signal D-75 and outputs the series of samples of the digital recovery picture signal D-35 at the nyquist rate on a time-sequential basis as ..., $X(m,n-1)$, ..., $X(m+1,n)$, ..., $X(m,n+1)$, ... This series of adaptive digital recovery picture signals $Z(m,n)$ (D-35) are recovered as the adaptive analog recovery picture signal D-36 through operation of the D/A converter D-10.

As explained above, according to the subnyquist sampling system composed of the adaptive prefilter D-31, subsampler D-6, adaptive interpolation filter D-34, etc., of the present invention, pictures can be recovered with less loop noise and interpolation noise and deterioration in resolution even when the amount of data is reduced to a half.

Figure 1:
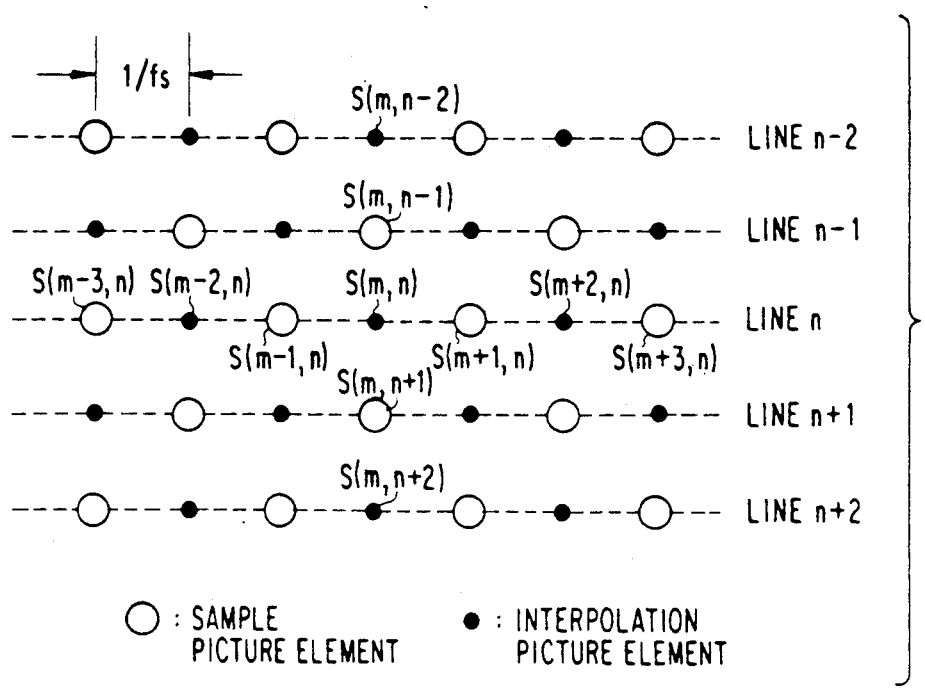
FIG. 1 is a diagram showing the arrangement of picture signal samples extracted by subsampling from a series of picture signals arranged in the form of a square lattice.
Figure 2:
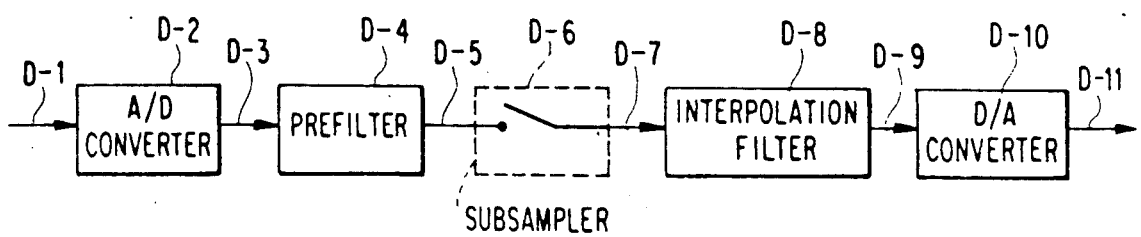
FIG. 2 is a block diagram of a conventional subnyquist sampling system.
Figure 3:
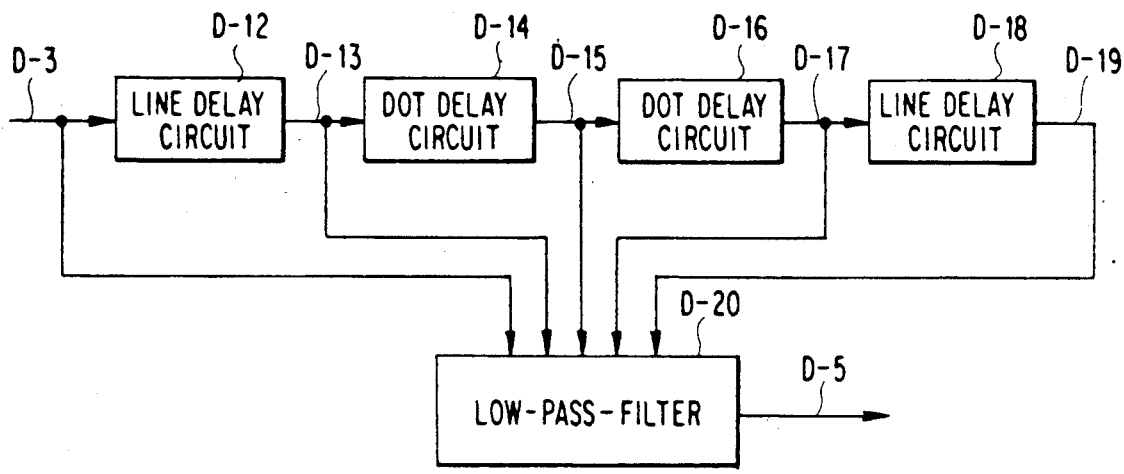
FIG. 3 and FIG. 4 are block diagrams of a prefilter circuit and an interpolation filter circuit employed in the subnyquist sampling system of FIG. 2.
Figure 4:
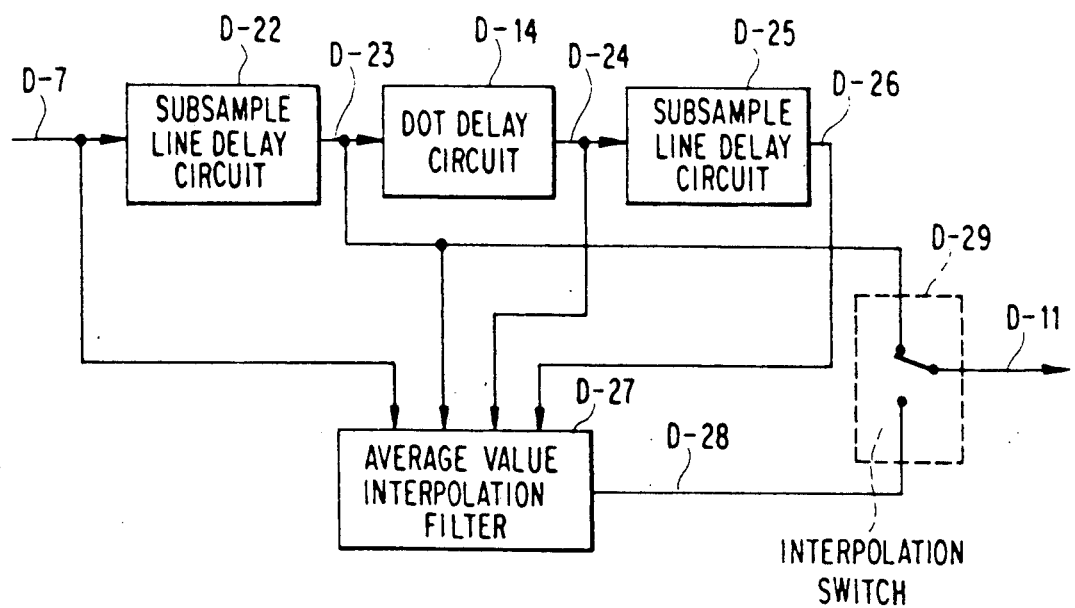
Figure 5:
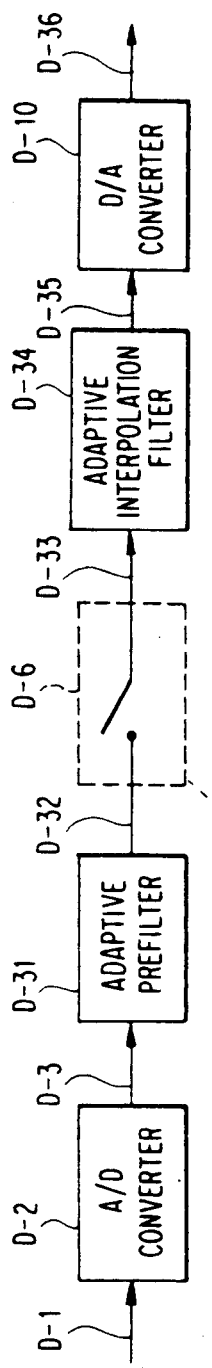
FIG. 5 is a block diagram indicating a subnyquist sampling system utilizing a subnyquist sampling filter of the invention.

Regarding above the embodiment, an in-field subnyquist sampling system is described, but the present embodiment can also be adapted to a subnyquist sampling system having an allocation as shown in FIG. 1 in a plurality of frame periods by introducing a frame memory. Moreover, in case the sample picture element positions are inverted alternately between the fields and frames in time, it is possible to use the interpolation filter to introduce the activity in the time direction.

In above embodiment, the filter is changed in such a direction as the minimum activity, but it is also possible to change the filter at the medium activity (center value).

We claim:

1. A subnyquist sampling filer comprising: an adaptive prefilter means for detecting a degree of change in a picture signal level around a given picture element in a picture signal train sampled in the form of a square lattice at a nyquist rate and low-pass filtering from a direction in which a degree of change in said picture signal level in is a minimum, subsampler means for extracting picture elements in time sequence through alternate phase inversion for each line of an image for picture signals output from said adaptive prefilter means and performing subnyquist sampling so that the picture signal samples are reduced in number, and adaptive interpolation filter means for producing an interpolation signal from a peripheral picture signal in such a direction that a degree of change in said picture signal subjected to subnyquist sampling said subsampler and regenerates said picture signal at the nyquist rate by selectively and alternately outputting said picture signal which is subjected to subnyquist sampling and said interpolation signal.

2. The subnyquist sampling filter according to claim 1, wherein low-pass filtering and interpolation are executed from a direction where a degree of change of a picture signal level around said given said picture elements is a medium value.

3. The subnyquist sampling filter according to claim 1, wherein pre-low-pass filtering and interpolation filter processing are executed utilizing a degree of change of picture signal level around said given picture element on the basis of space and time, and wherein same picture element position is alternately subjected to subnyquist sampling in a plurality of frame periods.

4. The subnyquist sampling filter according to claim 1, wherein an absolute value of difference between two adjacent picture elements in each direction is employed as a degree of change of picture signal level in the periphery of said picture elements.

5. The subnyquist sampling filter according to claim 1, further comprising adaptive prefilter means for executing second-order low-pass filtering on a center picture element with the picture signals of the adjacent two pairs of picture elements in such a direction that a degree of change of picture signal level around said center picture element is a minimum, and adaptive interpolation filter means operating in response to an average value of a picture signal of an adjacent two pairs of picture elements in such a direction that a degree of change of picture signal level in the periphery of picture elements allowing subtraction of picture elements by said subsampler as the interpolation signal.

6. A filter for a digitized color television signal, comprising:
means for determining a direction from a given image point in said color television signal in which a minimum amount of change occurs over a predetermined distance; and
means for performing a predetermined filtering operation on said color television signal in response to said determination, said predetermined filtering operation comprising subnyquist filtering of said color television signal having a portion of the information content thereof removed.

* * * * *